(12) United States Patent
Cooke

(10) Patent No.: US 8,928,387 B2
(45) Date of Patent: Jan. 6, 2015

(54) TUNABLE CLOCK DISTRIBUTION SYSTEM

(71) Applicant: Laurence H. Cooke, Los Gatos, CA (US)

(72) Inventor: Laurence H. Cooke, Los Gatos, CA (US)

( * ) Notice: Subject to any disclaimer, the term of this patent is extended or adjusted under 35 U.S.C. 154(b) by 0 days.

(21) Appl. No.: 13/891,328

(22) Filed: May 10, 2013

(65) Prior Publication Data

US 2014/0333364 A1    Nov. 13, 2014

(51) Int. Cl.
*H03K 3/00*    (2006.01)
*H03K 5/15*    (2006.01)

(52) U.S. Cl.
CPC .................................. *H03K 5/15013* (2013.01)
USPC .............. 327/295; 327/296; 327/525; 365/96

(58) Field of Classification Search
USPC .................. 327/295–297, 525; 365/96, 225.7
See application file for complete search history.

(56) References Cited

U.S. PATENT DOCUMENTS

| | | | |
|---|---|---|---|
| 4,495,629 A | 1/1985 | Zasio et al. | |
| 5,130,568 A | 7/1992 | Miller et al. | |
| 5,742,798 A | 4/1998 | Goldrian | |
| 6,297,998 B1 * | 10/2001 | Van de Graaff et al. | 365/201 |
| 6,424,198 B1 | 7/2002 | Wolford | |
| 6,651,237 B2 | 11/2003 | Cooke et al. | |
| 7,095,265 B2 * | 8/2006 | Nguyen et al. | 327/293 |
| 7,180,361 B2 * | 2/2007 | Takai | 327/525 |
| 7,710,813 B1 * | 5/2010 | Im et al. | 365/225.7 |
| 7,719,315 B2 | 5/2010 | Ngo et al. | |
| 7,817,456 B2 * | 10/2010 | Kurjanowicz | 365/96 |
| 2008/0246025 A1 * | 10/2008 | Nomura et al. | 257/40 |
| 2009/0310266 A1 * | 12/2009 | Etherton et al. | 361/56 |
| 2010/0244144 A1 * | 9/2010 | Hsueh et al. | 257/379 |

* cited by examiner

*Primary Examiner* — Lincoln Donovan
*Assistant Examiner* — Thomas Skibinski
(74) *Attorney, Agent, or Firm* — Panitch Schwarze Belisario & Nadel LLP

(57) ABSTRACT

A memory-like structure composed of variable resistor elements for use in tuning respective branches and leaves of a clock distribution structure, which may be used to compensate for chip-by-chip and/or combinatorial logic path-by-path delay variations, which may be due, for example, to physical variations in deep submicron devices and interconnections, is presented. A single system clocked scan flip-flop with the capability to perform delay test measurements is also presented. Methods for measuring combinatorial logic path delays to determine the maximum clock frequency and delays to program the variable resistors, as well as methods for calibrating and measuring the programmed variable resistors, are also presented.

8 Claims, 14 Drawing Sheets

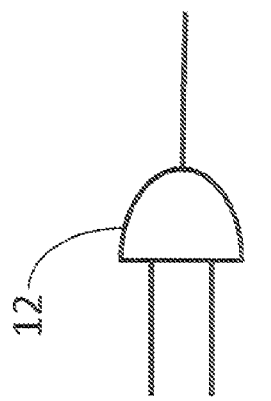
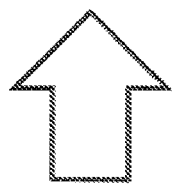
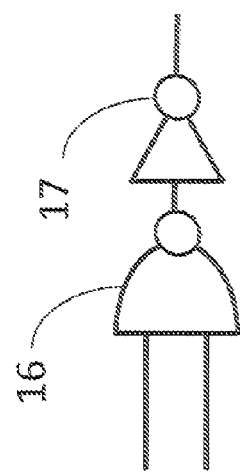
Figure 1b
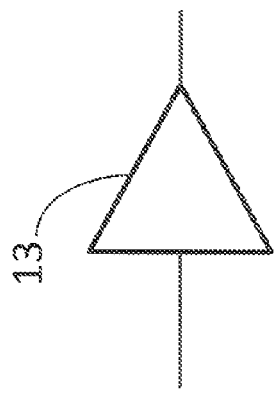
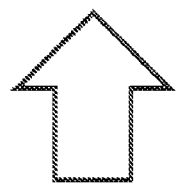
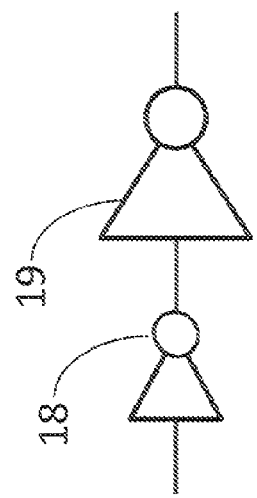
Figure 1c

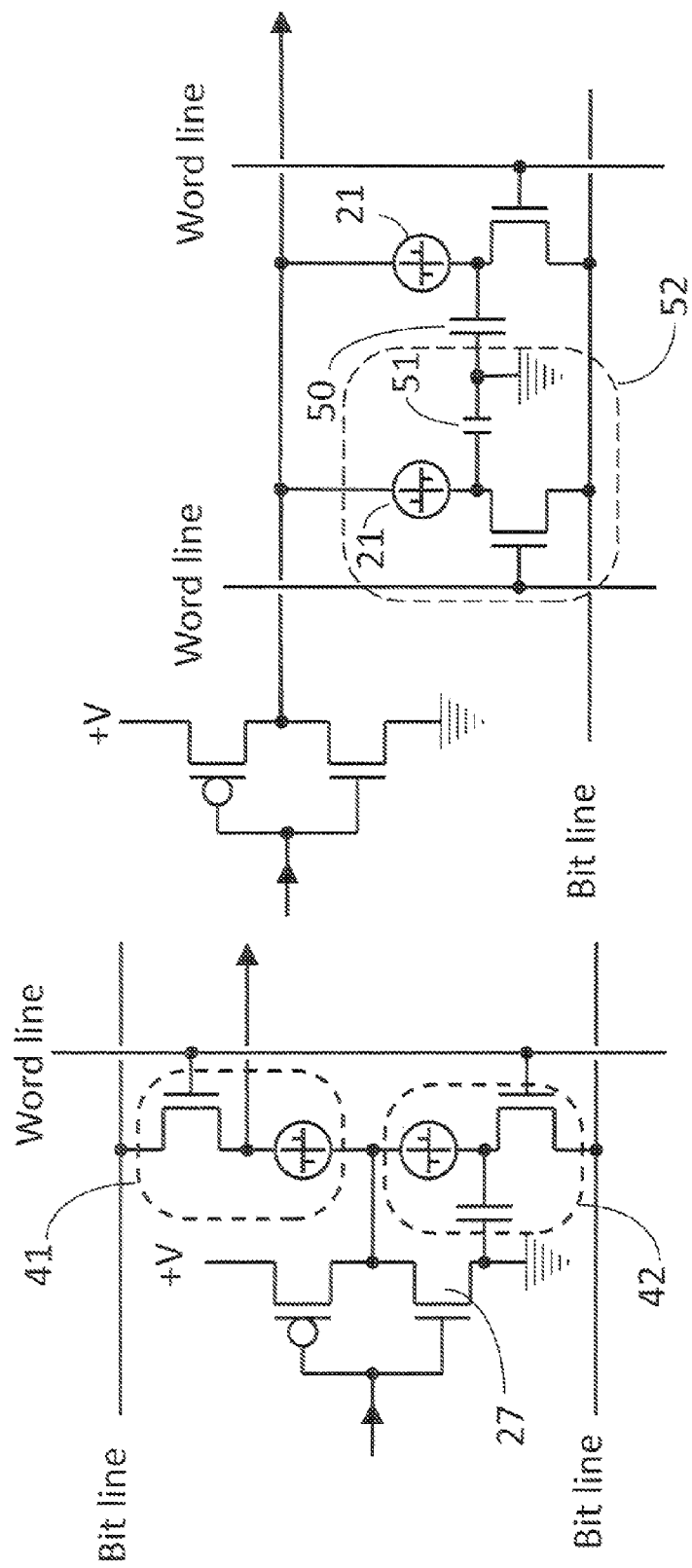

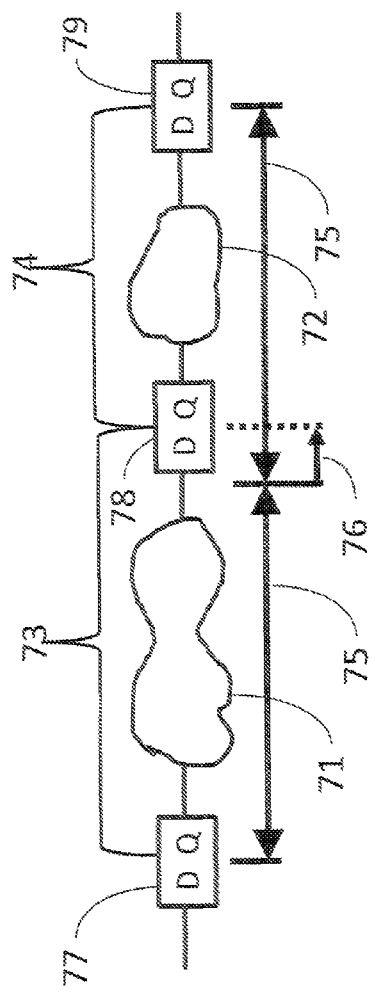
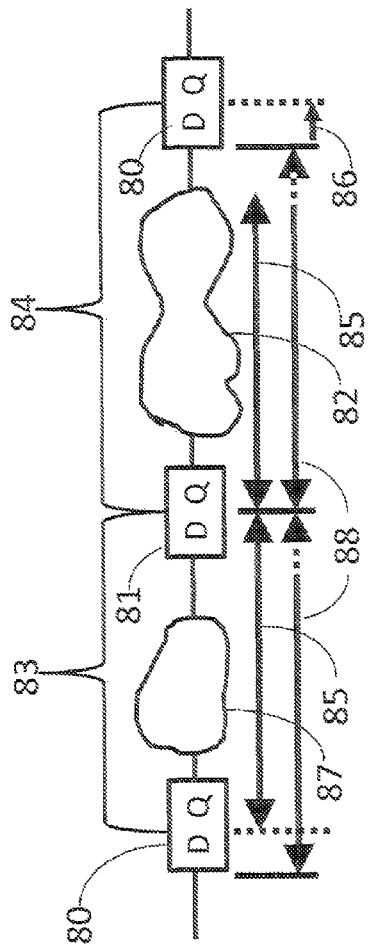

Figure 13

TUNABLE CLOCK DISTRIBUTION SYSTEM

FIELD OF THE INVENTION

Embodiments of the present invention may relate to a process for creating and tuning clocks in a high speed synchronous deep submicron integrated circuit.

BACKGROUND OF THE INVENTION

Traditionally, tuning may have been primarily performed on memory clocks, as in U.S. Pat. No. 6,424,198 granted Jul. 23, 2002 to Wolford, or between chips as in U.S. Pat. No. 5,742,798 granted Apr. 21, 1998 to Goldrian, but on an integrated circuit (IC), tuning clocks has primarily consisted of configuring phase-locked loops (PLLs) or scan clocks, e.g., as presented in U.S. Pat. No. 7,719,315 granted May 18, 2010 to Ngo et al. Recently, in very deep submicron integrated circuit (IC) processes, the metal and semiconductor traces have become so small that the physical structures of their edges may dominate their electrical characteristics. In other words, from chip to chip, the variations in the lithographic processes of the individual wires and vias may vary their resistance and capacitance per unit length by as much as an order of magnitude. While a portion of this variation is a function of design, most of it is a function of fabrication. The variations may occur on a per via, per wire, per manufactured IC basis, regardless of how tight the process parameters are. If all combinatorial logic paths on an IC part were many levels of logic (10 or more), with each level consisting of long wires and large fan-outs, then these per unit length variations may partially average out. Still, for high speed designs, where the critical logic paths consist of 5 or fewer levels of logic, each with short segments and limited fan-out, the variation may be quite large.

In order to improve the performance of such chips, it may be necessary to tune their clocks on a register or even an individual flip-flop basis. This disclosure provides a physical structure and process for fine tuning IC clocks for respective flip-flops, on a chip-by-chip basis.

SUMMARY OF EMBODIMENTS OF THE INVENTION

Various embodiments of the invention may relate to clock distribution structures using antifuse or phase change memory elements and methods for tuning the clock distribution structures.

In one embodiment each flip-flop may be clocked by a clock distribution structure, where each branch of the clock distribution structure may contain tunable inverters, which may be tuned by varying either the capacitance or the resistance on the output of the inverter.

In another embodiment the variable capacitances and resistances may form a programmable memory where variable resistors may be programmed to vary the delay of the clock signals to each flip-flop. Furthermore, the memory may include structures for measuring the variable resistors and calibrating the memory programming structure.

In one embodiment, if the contents of the flip-flops may be observed and set in a manner similar to what was presented in U.S. Pat. No. 4,495,629 granted Jan. 22, 1985, to Zasio et al., diagnostic tests may be repeatedly run on the IC, decreasing the clock period by some incremental delay with each iteration until failures occur. Thereafter, the IC may be repeatedly reset, and the failing diagnostic may be repeatedly run for successively greater numbers of clock cycles, until one or more failures are detected in the scanned contents of the flip-flops. For each flip-flop that contained a failure, a "logic cone" model for "path simulation" may be created by including all the flip-flops and logic that may have affected the value of the flip-flop containing the failure in a model. Such a model may include structures that may be used to "path simulate" or trace from sources of potential errors to the flip-flop that contains the error, in a manner analogous to the structures employed in deductive or concurrent fault simulation models. The model may then be simulated to determine the paths that may have produced the failure. The delay of the fastest clock that incurred no errors may then be assigned to the paths that previously produced the failures of the contents of the flip-flops. In this manner, the delays to all source-to-target internal flip-flops may be determined. Using these delays, the IC's clock frequency may be determined, and the residual delays may be programmed into the tunable clock distribution structure.

In another embodiment, if the contents of each flip-flop may be propagated and subsequently captured on successive clocks in a manner similar to U.S. Pat. No. 5,130,568 granted Jul. 14, 1992 to Miller et al., then case-specific tests with propagation through combinatorial logic paths to one or more internal flip-flops may be run on the IC, repeatedly increasing the clock frequency until failures occur. The shortest clock period may then be assigned to each failing combinatorial logic path. Using the delays for these combinatorial logic paths, the clock frequency may be determined, and the residual delays may be programmed into the tunable clock distribution structure. While Miller's flip-flop may improve the test process by eliminating the need for repeated testing, it may require separating the master and slave clocks, thereby increasing the potential skew between them.

Therefore, another embodiment of the present invention may include an improved scan flip-flop, which may propagate and capture data on successive clock cycles and may use the same system clock signals for both the master and slave latches to minimize clock skew.

In yet another embodiment, a method for finding the maximum clock frequency for the IC and the delays to be programmed into tunable inverters is presented. The method may use a table of the longest delays of the combinatorial paths between source and target flip-flops and may repeatedly increment the clock period by the incremental delay used in testing the IC and iteratively accumulate the maximum incremental combinatorial logic path delays between source and target flip-flops over the given clock period until the clock delays for the flip-flops converge. These clock delays may then be distributed across all the tunable inverters in the clock distribution system such that each flip-flop has its appropriate delay.

BRIEF DESCRIPTION OF THE DRAWINGS

Various embodiments of the invention will now be described in connection with the attached drawings, in which:

FIGS. 1a, 1b and 1c are logical diagrams of examples of clock distribution on an IC, FIG. 4 is a diagram of an example of a capacitive-resistive tunable inverter, FIG. 5 is a diagram of an example of a multi-capacitive tunable inverter, FIG. 7 is a diagram of two clock cycles with a long combinatorial logic path on the first cycle, FIG. 8 is a diagram of two clock cycles with a long combinatorial logic path on the second cycle.

DESCRIPTION OF VARIOUS EMBODIMENTS

Embodiments of the present invention are now described with reference to FIGS. 1-15, it being appreciated that the figures may illustrate the subject matter of various embodiments and may not be to scale or to measure.

Figure 1A:
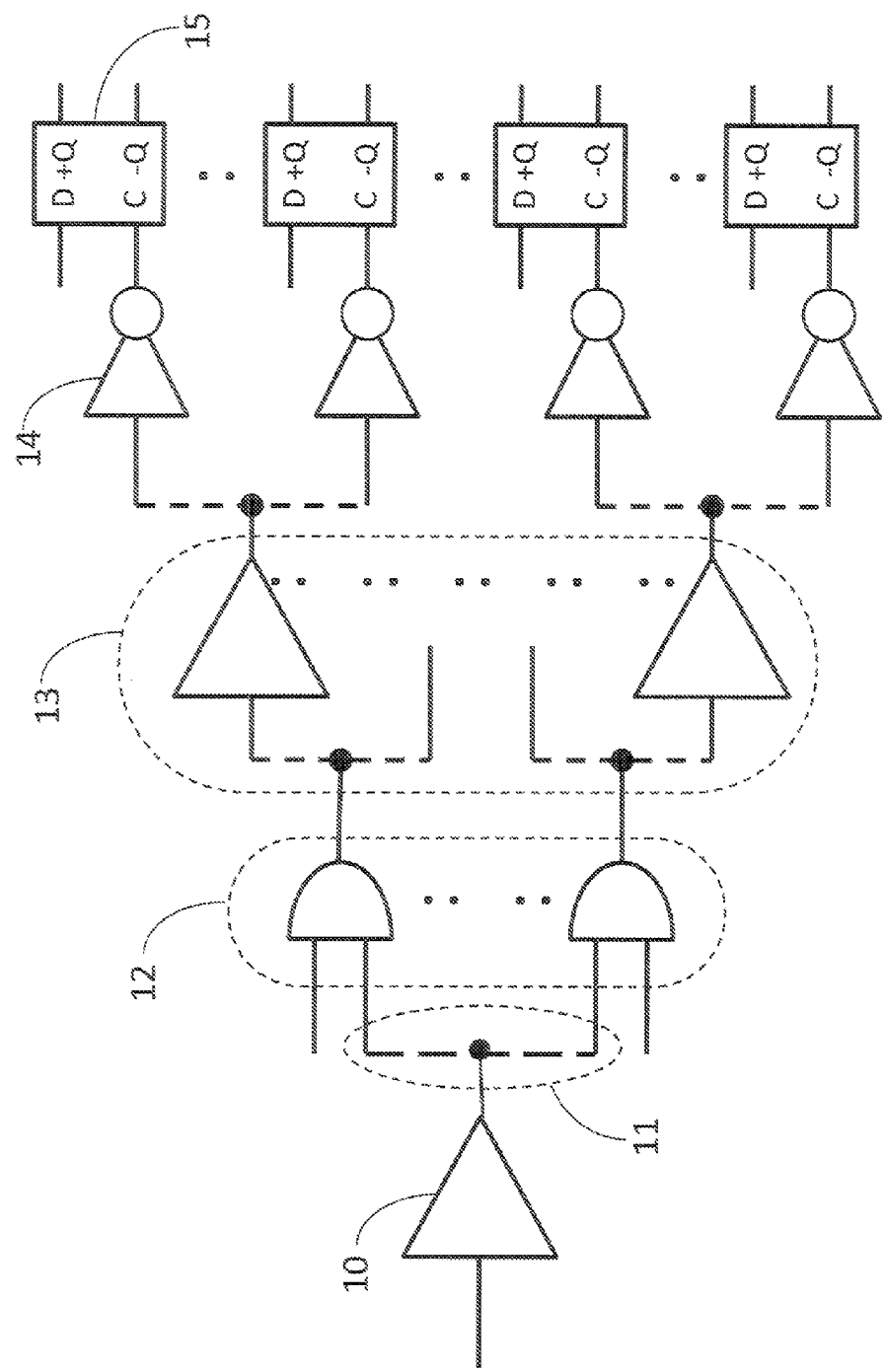

Reference is made to FIG. 1a, a diagram of an example of clock distribution on an IC. Some alternatives may include the input buffer 10 being distributed 11 through an H-tree structure similar to U.S. Pat. No. 6,651,237 granted Nov. 18, 2003 to Cooke et al. Following optional clock enable gates 12, there may be multiple stages of buffers 13, which may drive optional inverting buffers 14 that may then drive one or more flip-flops 15, latches or other types of storage elements, for example. Typically, the respective enables 12 may be composed of a two-input NAND gate 16 followed by an inverter 17, as shown in FIG. 1b, and the respective buffers 13 may be composed of a first inverter 18 that may drive a second inverter 19, which may be composed of larger transistors than inverter 18, as signified in FIG. 1c by its larger size. While such structures may be designed to minimize clock skew and clock delay, they are generally not tunable.

Figure 2:
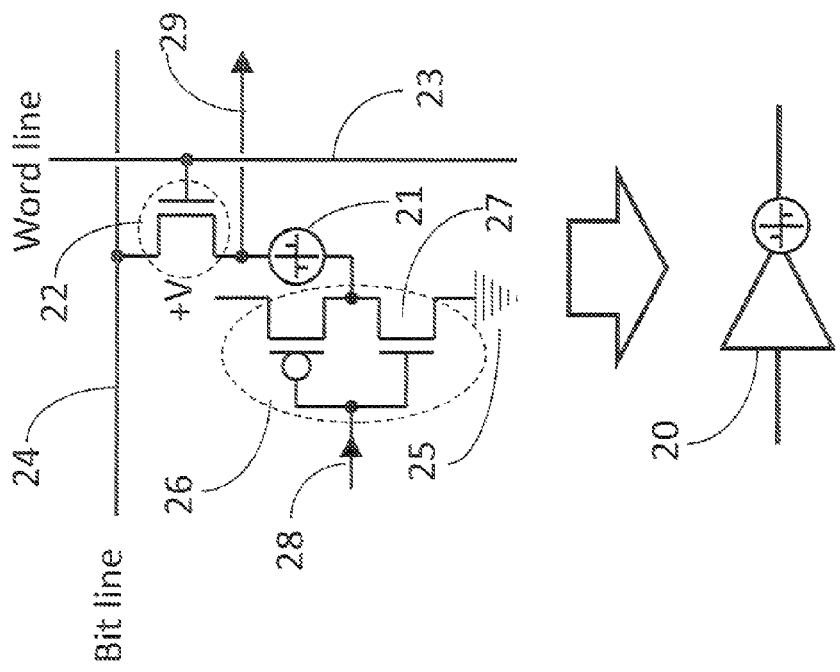
FIG. 2 is a diagram of an example of a resistive tunable inverter.

Reference is now made to FIG. 2, a diagram of an example of a resistive tunable inverter. An inverter 26 may be connected to a variable resistor 21, which may be programmed by setting the bit line 24 to a positive programming voltage (but note that, in other embodiments, different logic may be used, and this may be a negative programming voltage) and selecting the transistor 22 with the word line 23. When the inverter's input 28 is set high, current may then be driven through the variable resistor from the bit line 24 through the N-channel transistor 27 to ground 25. The variable resistor may be, for example, an anti-fuse or a phase change memory element, both of which may exhibit lower resistances after being programmed with higher programming voltages and/or longer programming times. In this case, the lower the programmed resistance, the faster the inverter's output 29 may charge the load it drives. In this manner, the inverter's 20 delay may be programmed. When using one-time programmable (OTP) anti-fuses, such as those constructed out of amorphous silicon, for the variable resistors, the normal "un-tuned" delays of the inverters may correspond to fully-programmed anti-fuses, limiting the ability to "retune" the tunable inverters. Also, if, during normal operation, frequent large currents flow through OTP amorphous silicon anti-fuses, the anti-fuses may become erroneously "re-programmed," which may incorrectly reduce the delay of the inverter, which may result in the inverter becoming "un-tuned."

Figure 3:
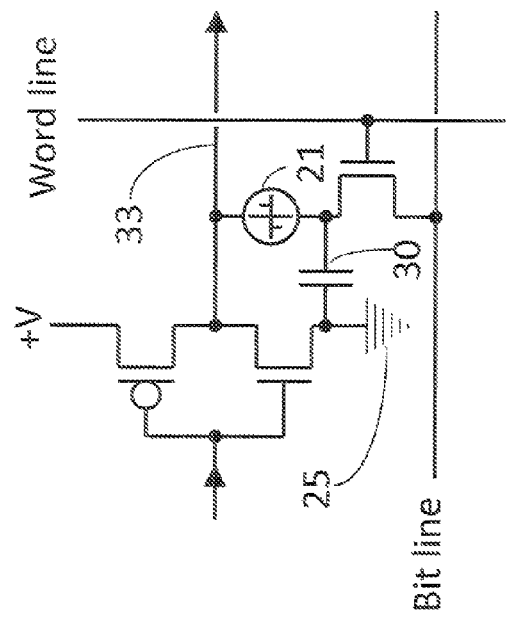
FIG. 3 is a diagram of an example of a capacitive tunable inverter.

Reference is now made to FIG. 3, a diagram of an example of a capacitive tunable inverter. The programming structure may be similar to the resistive tunable inverter shown in FIG. 2, but the variable resistor 21 may be connected between the output 33 and a capacitor 30, which may be coupled to ground 25. In this case, lowering the programmed resistance may serve to increase the delay of the inverter. This may be desirable, e.g., when the variable resistor is an anti-fuse because the inverter's normal operating condition may correspond to the un-programmed, high resistance state of the anti-fuse. This may also be desirable, e.g., when, as mentioned earlier, the OTP anti-fuse may only program in one direction, e.g., toward lower resistance, because it allows the anti-fuse to be repeatedly programmed, which may make possible incrementally increasing the inverter's delay until the device is properly tuned. It should be noted here that if such a device has become "un-tuned" with a delay that is too long, all the other branches of the tunable clock distribution structure may be delayed to tune the "un-tuned" flip-flop.

Reference is now made to FIG. 4, a diagram of an example of a capacitive-resistive tunable inverter. In this case, there may be structures for programming both resistive 41 and capacitive 42 variable resistors. As in the previous cases, both the resistive 41 and capacitive 42 structures may program their variable resistors through the N-channel transistor 27 to ground. Alternatively, there may be separate word lines and a combined bit line. When using OTP anti-fuse variable resistors, the double programming may permit programming both incremental increases and decreases to the inverter's delay, where successive programming of the capacitive structure 42 may increase the inverter's delay and successive programming of the resistive structure 41 may decrease the inverter's delay. In this manner, OTP anti-fuses may be used in place of multi-programmable multi-bit phase change memory elements.

Reference is now made to FIG. 5, a diagram of an example of a multi-capacitive tunable inverter. In this case, multiple variable resistors 21 may be connected to grounded capacitors 50 and 51 of different sizes. When the OTP anti-fuse or phase change memory elements may be programmed to only a limited number of resistance values, then it may be necessary to employ more than two structures 52, which may have different-sized capacitors, to adequately vary the delay of the tunable inverters. The incremental programmable delay of each successively larger capacitive element may be as large as the full span of programmable delay of the previous capacitive element. For example, if the variable resistors may be programmed to one of three levels, which we may call High, Medium and Low, then the capacitance of each successively larger element may be large enough such that the delay between Medium and High or between Medium and Low is less than or equal to the delay between High and Low on the previous element.

Figure 6A:
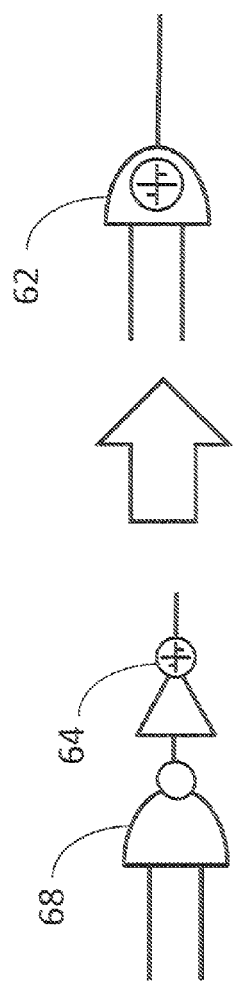
FIGS. 6a, 6b, and 6c are logical diagrams of examples of clock distribution on an IC utilizing tunable inverters.
Figure 6B:
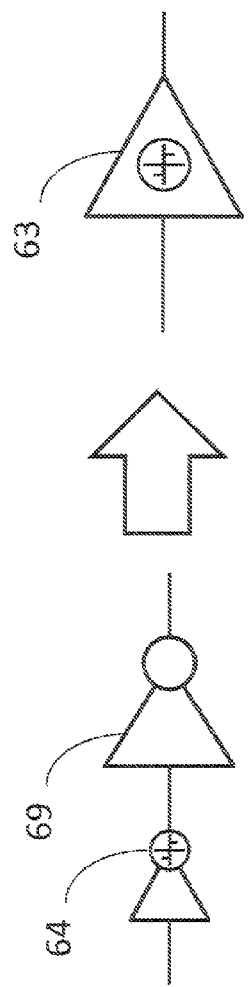
Figure 6C:
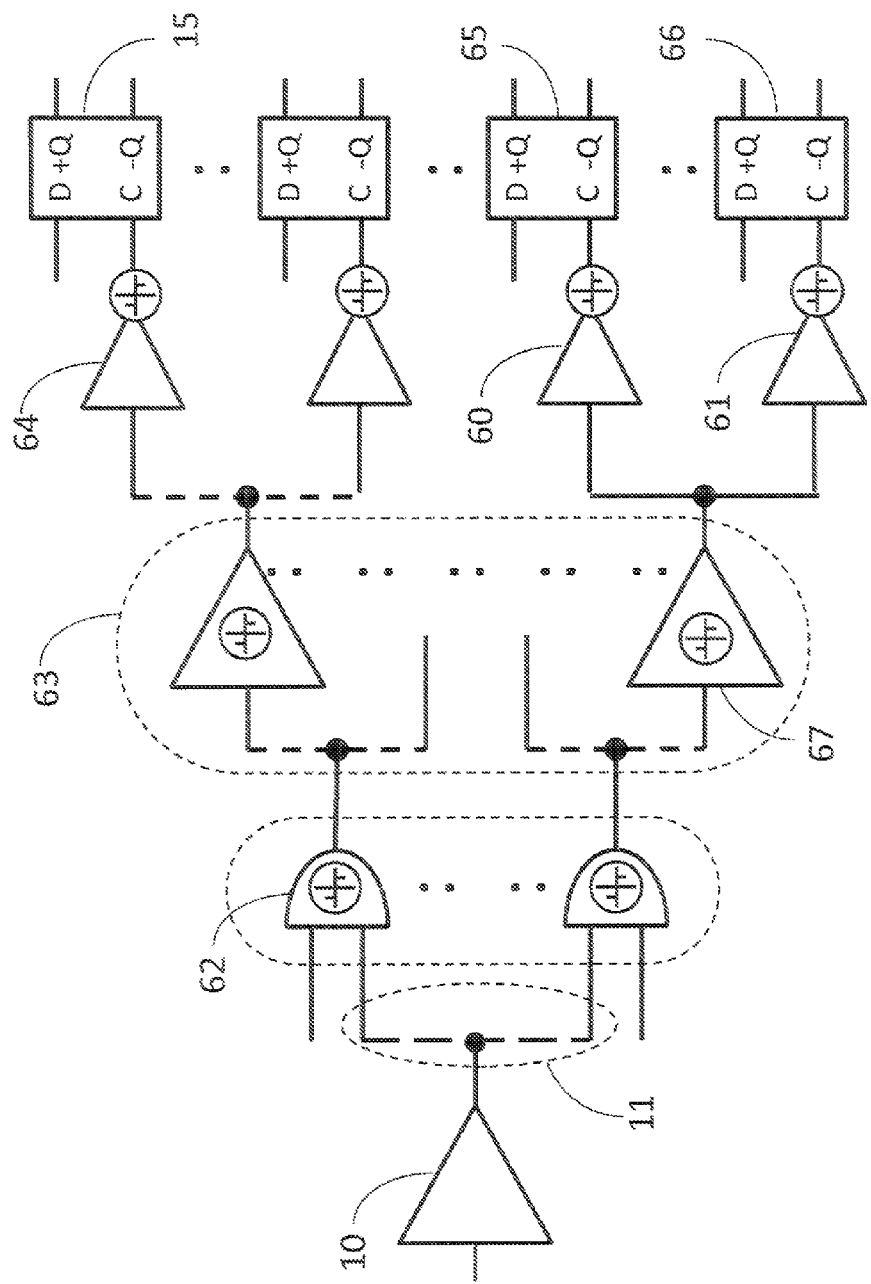

Reference is now made to FIGS. 6a, 6b, and 6c. Any one or a combination of the tunable inverters shown in FIGS. 2 through 5 may be used to form a tunable enable 62, which may be composed of a NAND gate 66 and a tunable inverter 64, as may be seen in FIG. 6a, or to form a tunable buffer 63, which may be composed of a tunable inverter 64 and a non-tunable inverter 69 (which may be composed of larger-sized transistors than the tunable inverter 64, as may be depicted by its larger size in FIG. 6b). Any or all of these elements may replace the corresponding non-tunable elements, including tunable inverters 64 driving the flip-flops 15, as may be seen in the example shown in FIG. 6c. In this manner, the components of delay required for all the flip-flops that may be driven by a common element may be programmed into one or more signal distribution paths from that element. For example, if the flip-flops 65 and 66 must both be delayed by a first amount of time, and one of them 66 must additionally be delayed by a second amount of time, then the tunable buffer 67 may be programmed to the first amount of time delay, and the tunable inverter 61 may be programmed with the second amount of time delay, while the tunable inverter 60 may not be programmed, or may be programmed with no delay.

Reference is now made to FIG. 7, a diagram of two clock cycles with a long combinatorial logic path on the first cycle. In another example, there may be a long combinatorial logic path 71 with a long propagation time 73 between the first flip-flop 77 and the second flip-flop 78, and a short combinatorial logic path 72 with a short propagation time 74 between the second flip-flop 78 and the third flip-flop 79. In that case, the propagation time from the first 77 to the third flip-flop 79 may be two clock cycles 75. Without adjustment, the second flip-flop 78 may be clocked too early. To correct this, the tunable clock distribution structure may be programmed to delay the clock 76 to the second flip-flop 78.

Reference is now made to FIG. 8, a diagram of two clock cycles with a long combinatorial logic path on the second cycle. In this example, there are only two flip-flops 80 and 81, with a short path 87 from the first flip-flop 80 to the second flip-flop 81 and a long path 82 from the second flip-flop 81 back to the first flip-flop 80. Unlike the previous example, in FIG. 7, the round-trip propagation time is greater than two clock periods. A new clock period may be defined as the average of the two propagation delays 83 and 84. Using this new clock period, the clock of the first flip-flop 80 may be tuned to a delay 86 equal to the new clock period minus the short propagation time 83.

In order to be able to determine what delays may be programmed into a tunable clock distribution structure, it may be necessary to determine the maximum delay of all combinatorial logic paths between the internal flip-flops.

In one embodiment, diagnostics may be run using the normal IC clocks initially running at the normal IC clock periods, which may then be stopped, and the contents of internal flip-flops may be scanned out. In this case, the following method may be used to find the delays of the combinatorial logic paths:

a. Execute the diagnostic tests;
b. If no failure occurs, set an old clock period to the current clock period, decrement the current clock period, and go to a;
c. Set the number of clock cycles to 1;
d. Execute the failing diagnostic for the number of clock cycles;
e. Scan out the contents of the flip-flops and compare with good diagnostic values, and if no mismatch is detected, increment the number of clock cycles and go to d;
f. For each target flip-flop with a scan value that does not match its good diagnostic value, select the source flip-flops whose toggled value causes the simulated target flip-flop's value to change, and assign a delay value equal the old clock period to the combinatorial path between the source flip-flop and target flip-flop;
g. Set the old clock period to the current clock period, decrement the current clock period, and if the current clock period is greater than a limit, go to a.

Figure 9:
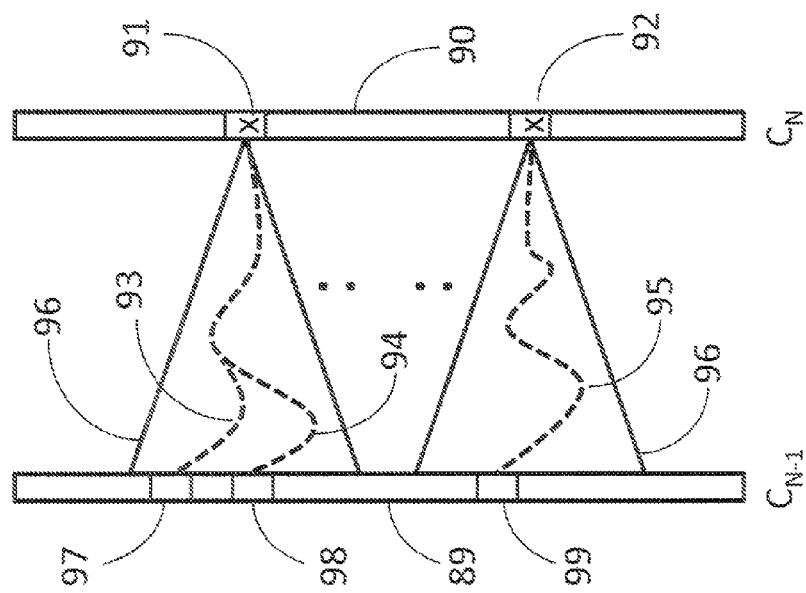
FIG. 9 is a diagram of a first failing clock cycle of a diagnostic test.

Reference is now made to FIG. 9, a diagram of a first failing clock cycle of a diagnostic test. Failures are shown in FIG. 9 as occurring on target flip-flops 91 and 92 within the contents of the internal flip-flops 90 on clock cycle $C_N$. The combinatorial logic paths 93, 94 and 95 that caused the errors may be determined by path simulation of the cones of logic 96 that determined the failing values of the flip-flops 91 and 92, using the contents of the internal flip-flops 90 from clock cycle $C_{N-1}$. This path simulation may be performed by toggling each source flip-flop in the cones of logic to verify that the source flip-flop toggles at least one of the failing target flip-flops, 91 for source flip-flops 97 and 98, and 92 for source flip-flop 99. The delay of the smallest clock period that incurred no errors may then be assigned to the combinatorial logic paths 93, 94 and 95, as defined by their source and target flip-flops. To determine the delay of all combinatorial logic paths that may be needed to program the tunable clock distribution structure, the diagnostics may be run to a failing clock cycle for clock periods down to a limit of $2*P_C-P_E$, where $P_C$ is the desired clock period designed for the IC and $P_E$ is the clock period of the first failing diagnostic, where $P_E>P_C$. At this clock period, failures may be due to short combinatorial logic paths whose propagation delay may completely offset the propagation delay of the longest combinatorial logic path. In this manner, the delays of all necessary combinatorial logic paths between the source and target flip-flops in the IC may be determined to within the increment of the clock period for the tests.

In another embodiment, if the values for each flip-flop may be externally scanned into the flip-flops, propagated through the combinatorial logic, and captured using two successive system clock pulses at a specified clock period, then the captured results may be scanned out of the IC and checked against good previously simulated results. The tests may be created with source and target flip-flop tags for each sensitized path in the test that is used in the normal operation of the IC, allowing the propagation delay of every combinatorial logic path between source flip-flops and the target flip-flops to be inferred by the clock period when the target flip-flop fails. These tests may be run on the IC, repeatedly reducing the clock period until failures occur, and thereafter incrementally reducing the clock period to $2*P_C-P_E$ as described above. In summary, assuming old and current clock periods initially larger than the normal IC clock periods, the following method, which may generally require fewer iterations than the previous method, may be used:

a. Select a scan test;
b. Scan in the test value, propagate the test values, capture the test results after a current clock period, and scan out the results;
c. For each target flip-flop with a scan value that does not match its good test value, assign a delay value equal to the old clock period to the combinatorial path between the target flip-flop and the source flip-flops associated with the target flip-flop for this test;
d. Select the next scan test, and if it exists, go to b;
e. Set the old clock period to the current clock period, decrement the current clock period, and if the current clock period is greater than the limit, go to a.

Figure 10:
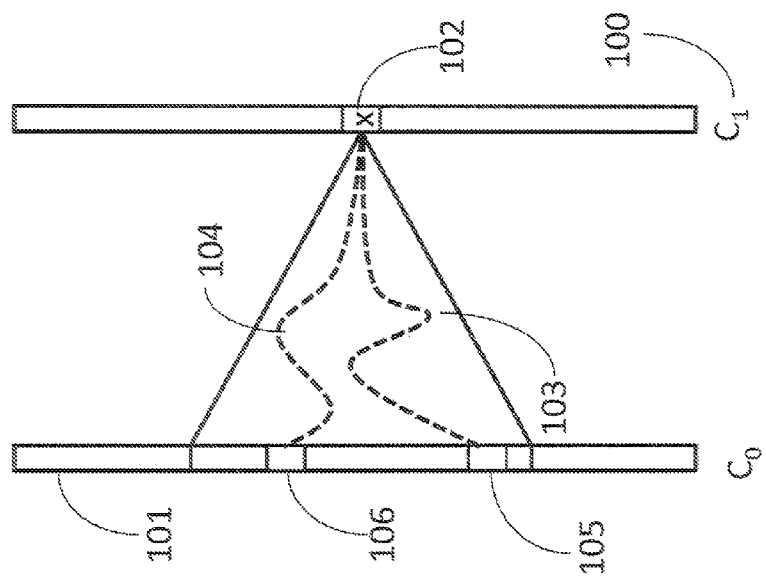
FIG. 10 is another diagram of a failing clock cycle.

Reference is now made to FIG. 10, another diagram of a failing clock cycle. In this case, path simulation at the time of IC testing may not be necessary because the tests that cause signals to be propagated through combinatorial logic paths 103 and 104 from respective source flip-flops 105 and 106 in the set of internal flip-flops 101, and to be captured in a target flip-flop 102 on the next clock 100, may be stored in a database linked to the pairs of source and target flip-flops measured on each test. The delay of the next slower clock may then be assigned to all pairs of source and target flip-flops whose target flip-flop failed on the test. In this manner, the delays of all necessary combinatorial logic paths between internal flip-flops in the IC may also be determined to within the incremental frequency of the tests.

Figure 11:
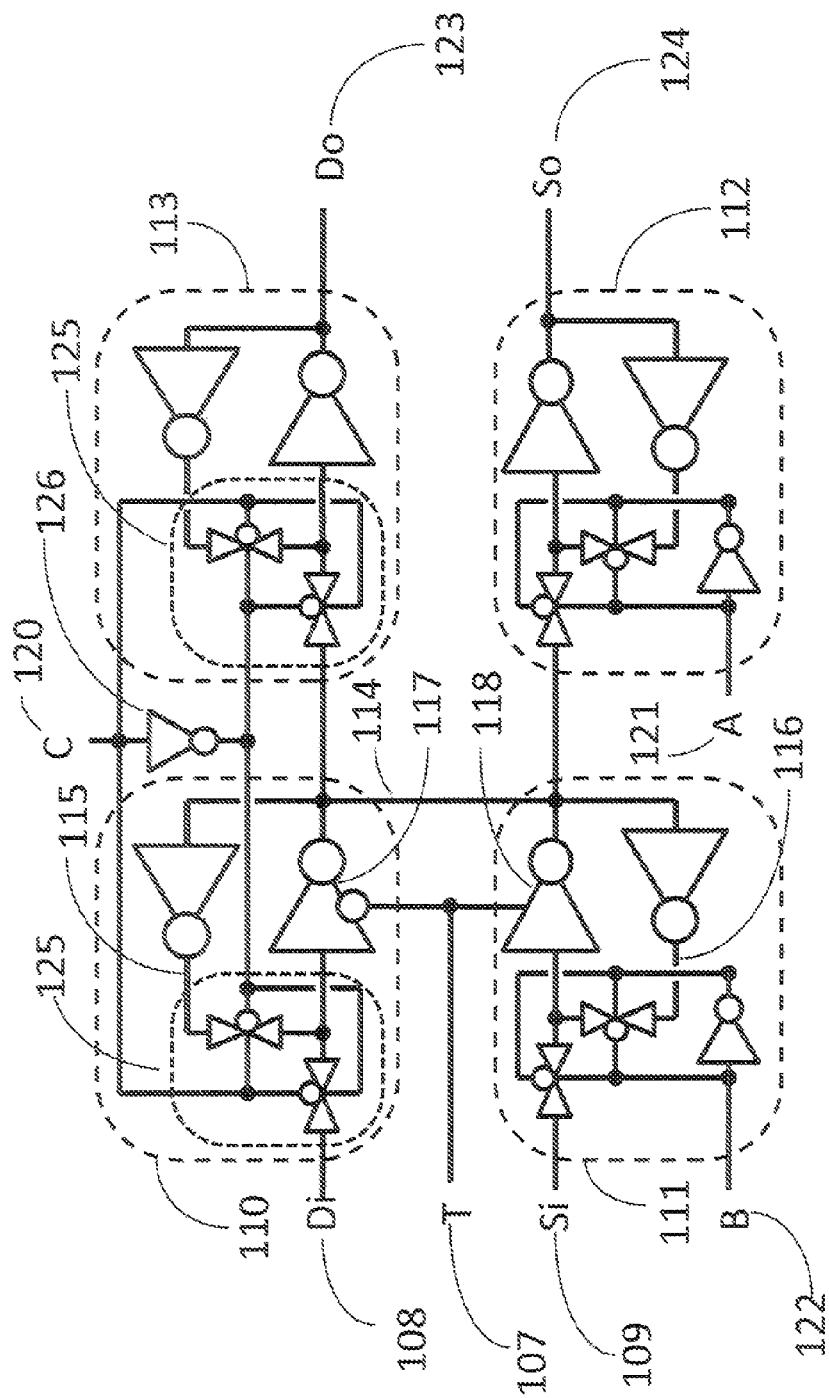
FIG. 11 is a logical diagram of an example of a scan flip-flop, according to an embodiment of the invention.

Reference is now made to FIG. 11, a logical diagram of an example of a scan flip-flop with a single clock driving both master and slave latches, according to another embodiment of the invention. In the example scan flip-flop of FIG. 11, the scan out latch 112 and slave latch 113 may be connected to a common output line 114 from the scan in latch 111 and master latch 110. The master latch 110 and the scan in latch 111 may have their own respective feedback lines 115 and 116 and tri-state inverters 117 and 118. The test line 107 may be set low during normal operation, which may disable the scan in latch's tri-state inverter 118 and may enable the master latch's tri-state inverter 118. During normal mode, the master latch 110 and slave latch 113 may form a flip-flop that may capture data from the data input 107 on a rising edge of the clock C 120, an example of which is indicated by 156 in FIG. 15. Clocking the A clock 121 while the test line is low may capture the contents of the flip-flop in the scan out latch 112, an example of which is indicated by 157 in FIG. 15. While the test line is low, the B clock 122 may not affect the scan flip-flop. Thereafter, setting the test line high may enable the scan in latch 111 to scan from the scan in input 109 with alternating B 122 and A 121 clocks to the scan out 124, an example of which is indicated by 158 in FIG. 15. When the test line 107 is high and the clock C 120 transitions high, the contents of the scan in latch 111 may propagate through the slave latch 113, an example of which is indicated by 159 in FIG. 15. If the test line transitions low with enough time before the next rising edge of the clock C 120 to capture hold the signal in the master latch 110, then the propagated signal in the master latch 110 may be captured, an example of which is indicated by 160 in FIG. 15. The master and slave latches' transmission gates 125 may be coupled to the C clock signal 120 and an inverter 126 of the clock, to allow for operation on opposite polarities of the C clock signal. It is also contemplated that the inverter 126 may be a tunable inverter, which may be used to minimize the skew between the positive and negative C clock polarities.

In another embodiment, given the delays of all single clock cycle paths between all source and target flip-flops used in normal operation, the maximum clock frequency and delays that may be programmed into the tunable clock distribution structure may be calculated using the following process:
  a) For each source flip-flop and target flip-flop that have one or more single clock cycle combinatorial logic paths between them, put the maximum of the delays for all single clock cycle combinatorial logic paths between the source flip-flop and the target flip-flop in a two-dimensional flip-flop pair table by their source and target flip-flops, and set the current clock period to a value less than the average of the delays of all the single clock cycle combinatorial logic paths.
  b) Set a current table of target flip-flop incremental delays to zero.
  c) For each target flip-flop, set an entry in a next table to the maximum of zero and the incremental source delay associated with the target flip-flop, where the incremental source delay associated with the target flip-flop is the maximum, over all source flip-flops for the target flip-flop, of the source-to-target delays from the flip-flop pair table, less the current clock period, plus the delay of the respective source flip-flop (i.e., the source flip-flop corresponding to the maximum source-to-target delay) in the current table.
  d) If the maximum of the entries in the next table is greater than or equal to the current clock period, then increment the current clock period by an incremental delay used in testing the IC, and go to step b).
  e) If the current table is not the same as the next table, transfer the next table contents to the current table, and go to step c).
  f) Set the delay values for each tunable inverter in order, starting from the closest to the input buffer, with a value equal to the minimum of the next table entries for all the flip-flops the inverter drives, and subtract the value from all the next table entries of the flip-flops that the inverter drives.

The resulting clock period may then be the current clock period, and the values to program into the tunable inverters may correspond to the delay values for the respective tunable inverters. It is also contemplated that step a) may be performed separately from the rest of the method, possibly when capturing the combinatorial logic path delays. It is also contemplated that the method may be applied using physical design data to define the delays required in the clock distribution structure, which may be hard-wired into the clock distribution structure. It is further contemplated that the method may be also be applied to tunable clock distribution structures with hard-wired delays to further tune them on a chip-by-chip basis.

Figure 12:
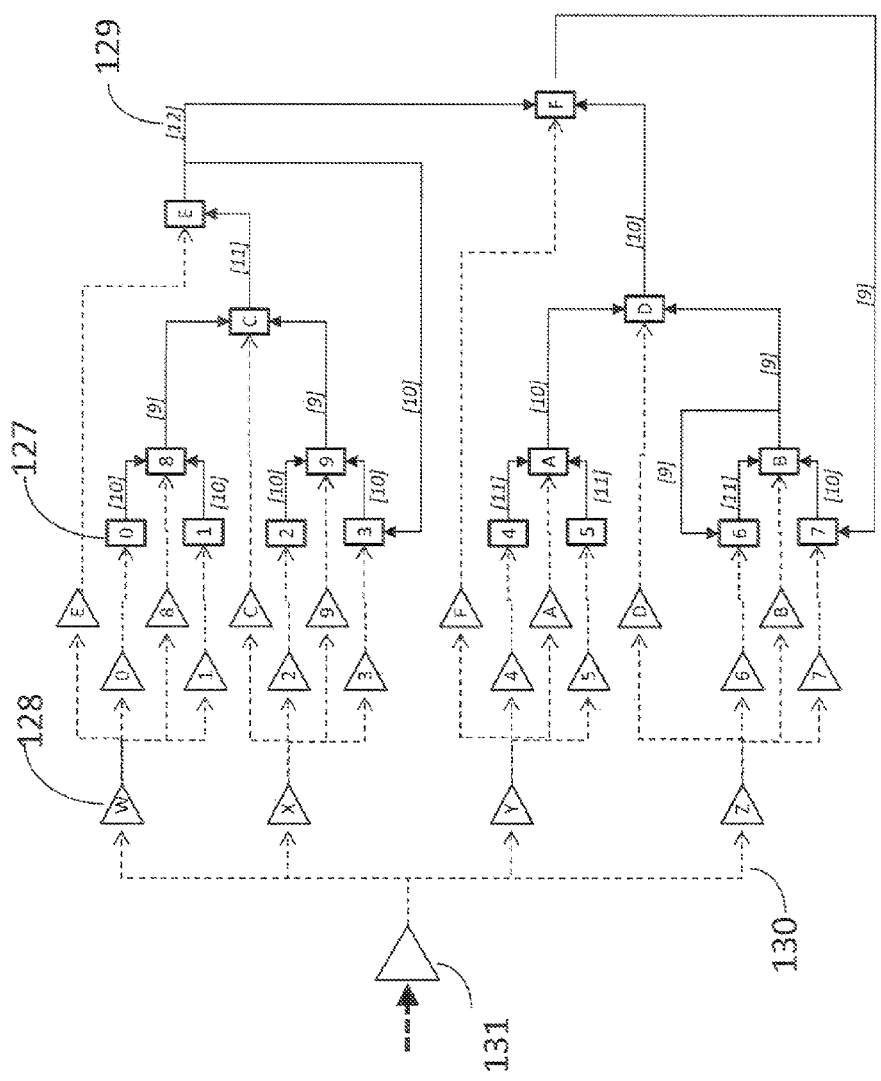
FIG. 12 is a simple flip-flop example, FIG. 13 are tables depicting an example of a method for calculating the maximum clock frequency and delays that may be programmed into the tunable clock distribution structure for the simple flip-flop example.

Reference is now made to FIG. 12, a simple flip-flop example. Labeled boxes 127 depict flip-flops, which, in this example, are labeled 0-9 and A-F. Solid arrows 129 depict combinatorial logic paths between flip-flops. The numbers in brackets [#] signify the maximum of the delays between the source and target flip-flops calculated in step a), which, at point 129 in the example, is [12] units of delay between flip-flops E and F. Labeled triangles 0 through F and W, X, Y, and Z depict the tunable buffers 128 within the tunable clock distribution structure. The dotted arrows 130 depict connections within the tunable clock structure between the input buffer 131 and tunable buffers W, X, Y, and Z. Other dotted arrows depict connections between tunable buffers W, X, Y, and Z and other tunable buffers or between a tunable buffer and its associated flip-flop.

Figure 13:
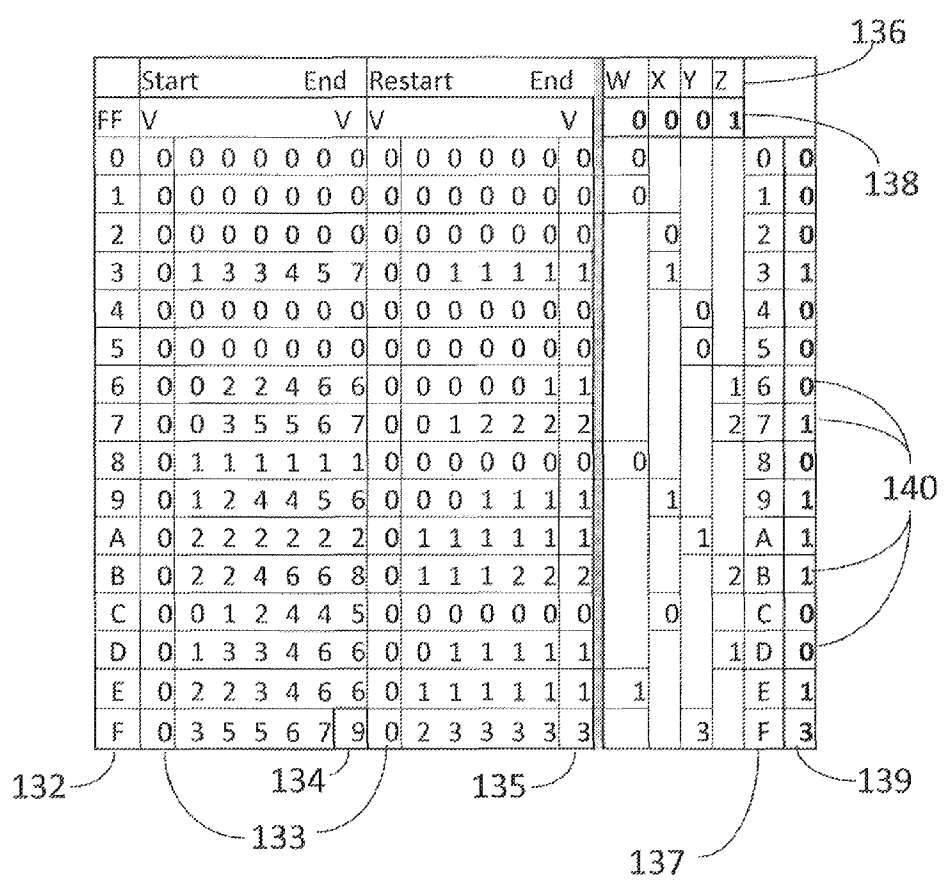

Reference is now made to FIG. 13, tables that may depict an implementation of the above method for calculating the maximum clock frequency and delays that may be programmed into the tunable clock distribution structure for the simple flip-flop example of FIG. 12. The first column 132 lists the flip-flop labels. For each flip-flop, step b) may set the current value to zero 133. Starting with an initial clock period of 9 time units (which is a value less than an average of the combinatorial delays), the next six columns represent the current or next values that may be obtained after repeated execution of steps c) through e). When the next value for flip-flop F 134 equals 9 units, the current clock period may be increased to 10 time units, and the current values may be reset to zeros 133. The process may continue until the next values 135 equal the current values of the previous cycle. The results may correspond to amounts by which the clocks may be delayed through the clock distribution structure out to the respective flip-flops. In step f), the row of delays 138 for the tunable buffers W, X, Y, and Z 136 closest to the input buffer 131 in FIG. 12 may be calculated first, then the column delays 139 for the rest of the tunable buffers 0 through F 137 may be calculated. Note that, in the example, the delay for buffer Z was subtracted from the remaining delays for flip-flops 6, 7, B, and D 140.

Figure 14:
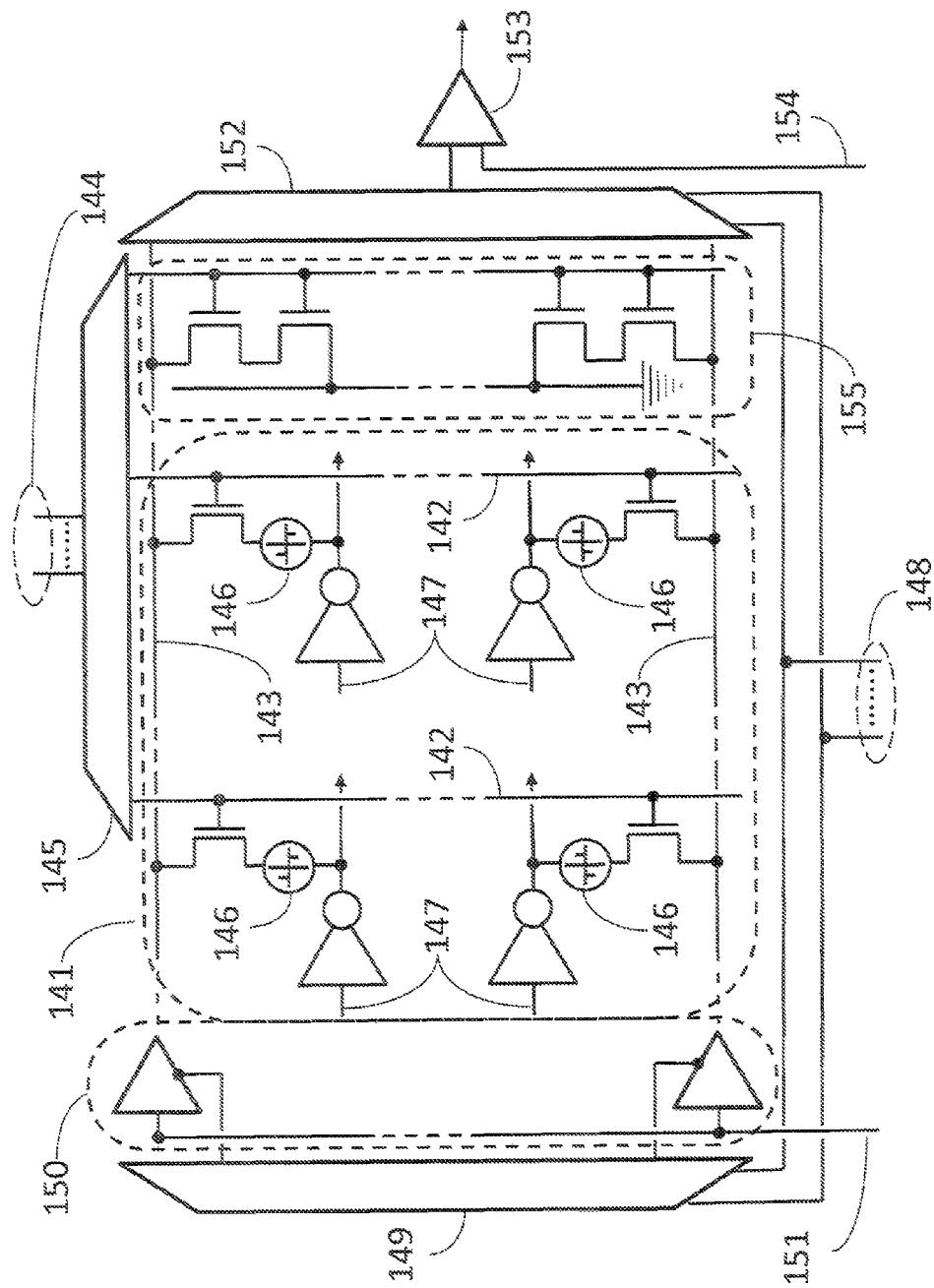
FIG. 14 is a diagram of an example of a control structure that may be used to program the variable resistors in a tunable clock distribution structure.
Figure 15:
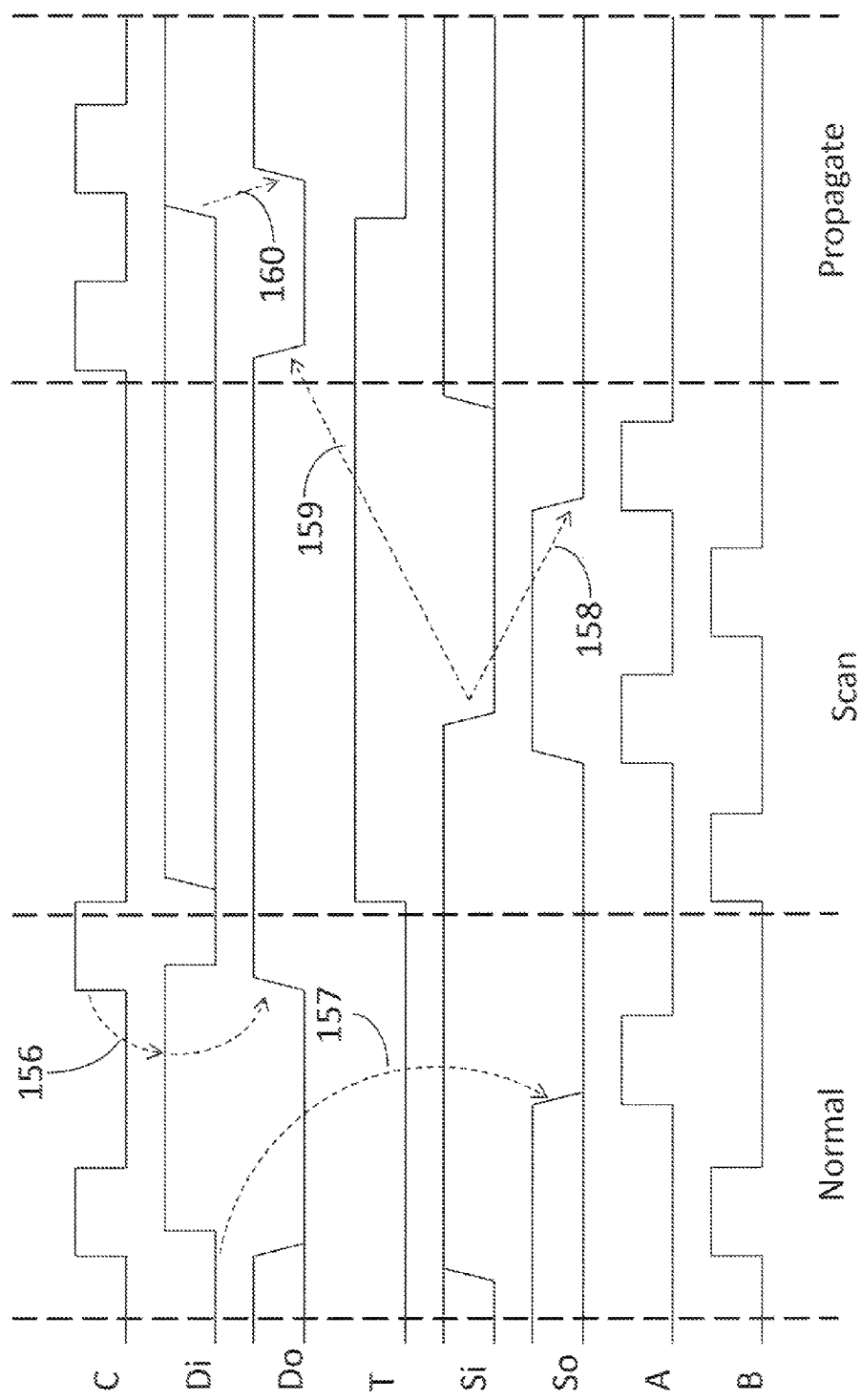
FIG. 15 is a timing diagram that may be associated with the scan flip-flop in FIG. 11.

Reference is now made to FIG. 14, a diagram of an example of a control structure that may be used to program the variable resistors in a tunable clock distribution structure. Tunable inverters may be organized into a two-dimensional array 141 and may be connected together with word lines 142 and bit lines 143. The word lines 142 may be selected by an address 144 entered into a decoder 145. One of the selected variable resistors 146 may be programmed by setting its inverter's input 147 low through the tunable clock distribution structure, addressing 148 the decoder 149 to select one of the tri-state bit line drivers 150, which may then drive a corresponding selected bit line 143 to the inputted 151 programming voltage. A multiplexor 152 may be used to select the bit line to differentially compare 153 its voltage with a reference voltage 154. In this manner, the selected variable resistor may be measured during or after programming. To calibrate such a measurement and the line drivers for programming, one word line may select a column of transistors 155, which may be structurally identical to the rest of the columns when programming, but without the variable resistor.

It will be appreciated by persons skilled in the art that the present invention is not limited by what has been particularly shown and described hereinabove. Rather the scope of the present invention includes both combinations an sub-combinations of various features described hereinabove as well as modifications and variations which would occur to persons skilled in the art upon reading the foregoing description and which are not in the prior art.

I claim:

1. A tunable clock distribution structure, comprising:
   a clock input;
   a plurality of flip-flops with clock inputs; and
   a plurality of buffers, forming a structure configured to distribute clock signals from the clock input through at least one of the plurality of buffers to the clock inputs of the plurality of flip-flops, wherein each of the plurality of buffers comprises an inverter having an output coupled to a programmable variable resistor capable of assuming more than two different non-zero resistance values;
   wherein the programmable variable resistor comprises:
   a bit line;
   a word line;
   a programming transistor coupled to the word line and to the bit line; and
   a variable resistor coupled to the programming transistor and the inverter;
   wherein, in one mode, the programming transistor, the variable resistor and the inverter form a path for current to flow to program the variable resistor's resistance.

2. A tunable clock distribution structure, comprising:
   a clock input;
   a plurality of flip-flops with clock inputs;
   a plurality of buffers, forming a structure configured to distribute clock signals from the clock input through at least one of the plurality of buffers to the clock inputs of the plurality of flip-flops, wherein each of the plurality of buffers comprises an inverter having an output coupled to a programmable variable resistor capable of assuming more than two different non-zero resistance values;
   a plurality of word lines;
   a first decoder configured to select one or more of the word lines;
   a plurality of bit lines each respectively driven by a respective line driver; and
   a second decoder configured to select one or more of the line drivers associated with the plurality of bit lines;
   wherein each of the programmable variable resistors is coupled to ground through a respective transistor within a respective tunable inverter within the clock distribution structure and coupled to a respective one of the plurality of bit lines through a respective transistor selected by one of the plurality of word lines selected by the first decoder.

3. The tunable clock distribution structure as in claim 2, where a voltage on the bit line driven by a respective one of the line drivers selected by the second decoder is configured to be measured by a differential amplifier.

4. The tunable clock distribution structure as in claim 2, further comprising:
   a plurality of pairs of transistors serially coupled between ground and a plurality of bit lines, wherein the pairs of transistors are selected by one of the plurality of word lines.

5. The tunable clock distribution structure as in claim 4, wherein a voltage on the respective bit line driven by a respective line driver selected by the second decoder is coupled through a pair of transistors selected by the one of the plurality of word lines and is configured to be measured by a differential amplifier.

6. A tunable clock distribution structure, comprising:
   a clock input;
   a plurality of flip-flops with clock inputs;
   a plurality of buffers, forming a structure configured to distribute clock signals from the clock input through at least one of the plurality of buffers to the clock inputs of the plurality of flip-flops, wherein each of the plurality of buffers comprises an inverter having an output coupled to a programmable variable resistor capable of assuming more than two different non-zero resistance values;
   a plurality of tunable enables; and
   a plurality of tunable buffers;
   wherein the plurality of buffers form a structure configured to distribute clock signals from the clock input through at least one of, the plurality of buffers, the plurality of tunable enables, and the plurality of tunable buffers, to each of the clock inputs of the plurality of flip-flops.

7. The tunable clock distribution structure as in claim 6, wherein each of the plurality of tunable enables comprises a NAND gate having an output coupled to an inverter having an output coupled to a programmable variable resistor.

8. The tunable clock distribution structure as in claim 6, wherein each of the plurality of tunable buffers comprises a first inverter having an output coupled to a programmable variable resistor having an output coupled to a second inverter.

* * * * *